United States Patent
Pyo et al.

(10) Patent No.: US 11,297,725 B2
(45) Date of Patent: Apr. 5, 2022

(54) DISPLAY DEVICE

(71) Applicant: LG ELECTRONICS INC., Seoul (KR)

(72) Inventors: Jonggil Pyo, Seoul (KR); Jaeyong Kim, Seoul (KR); Kwaneun Jin, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 202 days.

(21) Appl. No.: 16/622,251

(22) PCT Filed: Jan. 24, 2019

(86) PCT No.: PCT/KR2019/000993
§ 371 (c)(1),
(2) Date: Dec. 12, 2019

(87) PCT Pub. No.: WO2020/054923
PCT Pub. Date: Mar. 19, 2020

(65) Prior Publication Data
US 2021/0337684 A1    Oct. 28, 2021

Related U.S. Application Data

(60) Provisional application No. 62/729,975, filed on Sep. 11, 2018.

(51) Int. Cl.
*H05K 7/02* (2006.01)
*H05K 7/04* (2006.01)
*H05K 5/02* (2006.01)
*H05K 5/00* (2006.01)

(52) U.S. Cl.
CPC ......... *H05K 5/0217* (2013.01); *H05K 5/0017* (2013.01)

(58) Field of Classification Search
USPC ......................................................... 361/807
See application file for complete search history.

(56) References Cited

U.S. PATENT DOCUMENTS

| | | | |
|---|---|---|---|
| 2003/0075281 A1 | 4/2003 | Goldenberg et al. | |
| 2004/0107655 A1* | 6/2004 | Hudoba | E06B 9/90 52/202 |
| 2017/0103735 A1* | 4/2017 | Oh | G06F 1/1601 |

FOREIGN PATENT DOCUMENTS

| KR | 10-2006-0104809 | 10/2006 |
|---|---|---|
| KR | 10-2007-0014982 | 2/2007 |
| KR | 10-2017-0043347 | 4/2017 |
| KR | 10-2017-0062342 | 6/2017 |

OTHER PUBLICATIONS

PCT International Application No. PCT/KR2019/000993, International Search Report dated Jun. 7, 2019, 3 pages.

* cited by examiner

*Primary Examiner* — Hung S. Bui
(74) *Attorney, Agent, or Firm* — Lee Hong Degerman Kang & Waimey

(57) ABSTRACT

According to the present embodiment, a display device includes a frame having an opening, a roller assembly having a roller and mounted on the frame, a display module wound on the roller or unrolled from the roller, and a display operating mechanism mounted on the frame and connected with the display module to be unrolled in a direction crossing a direction of opening the opening or to be wound on the roller.

19 Claims, 15 Drawing Sheets

[Figure 1]
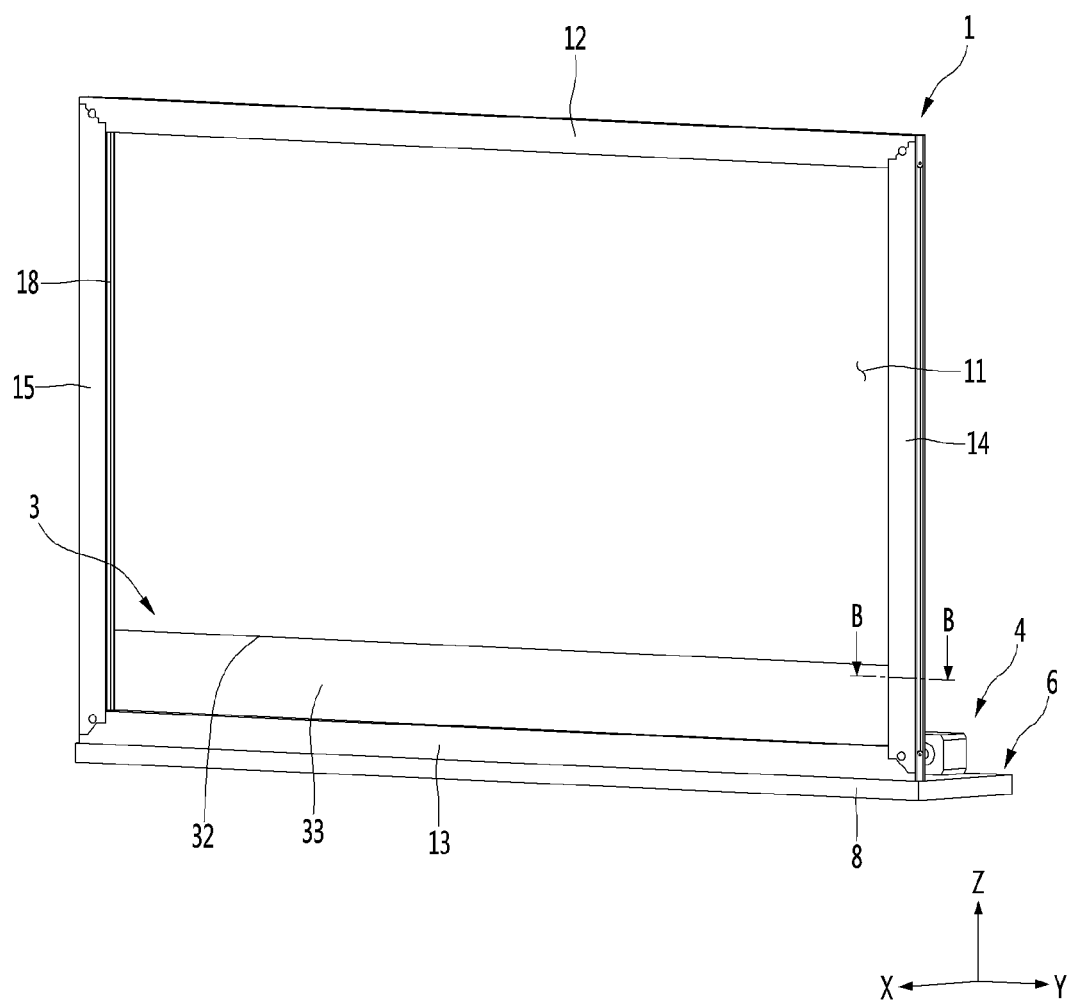

[Figure 2]
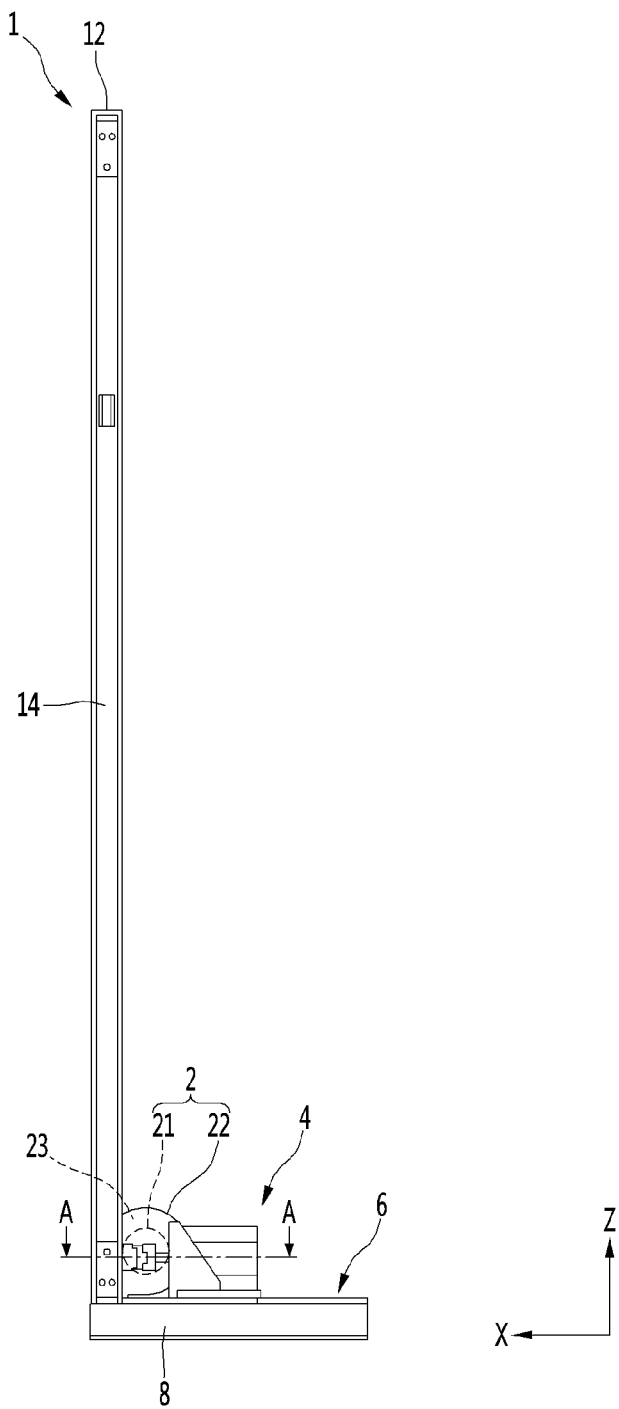

[Figure 3]
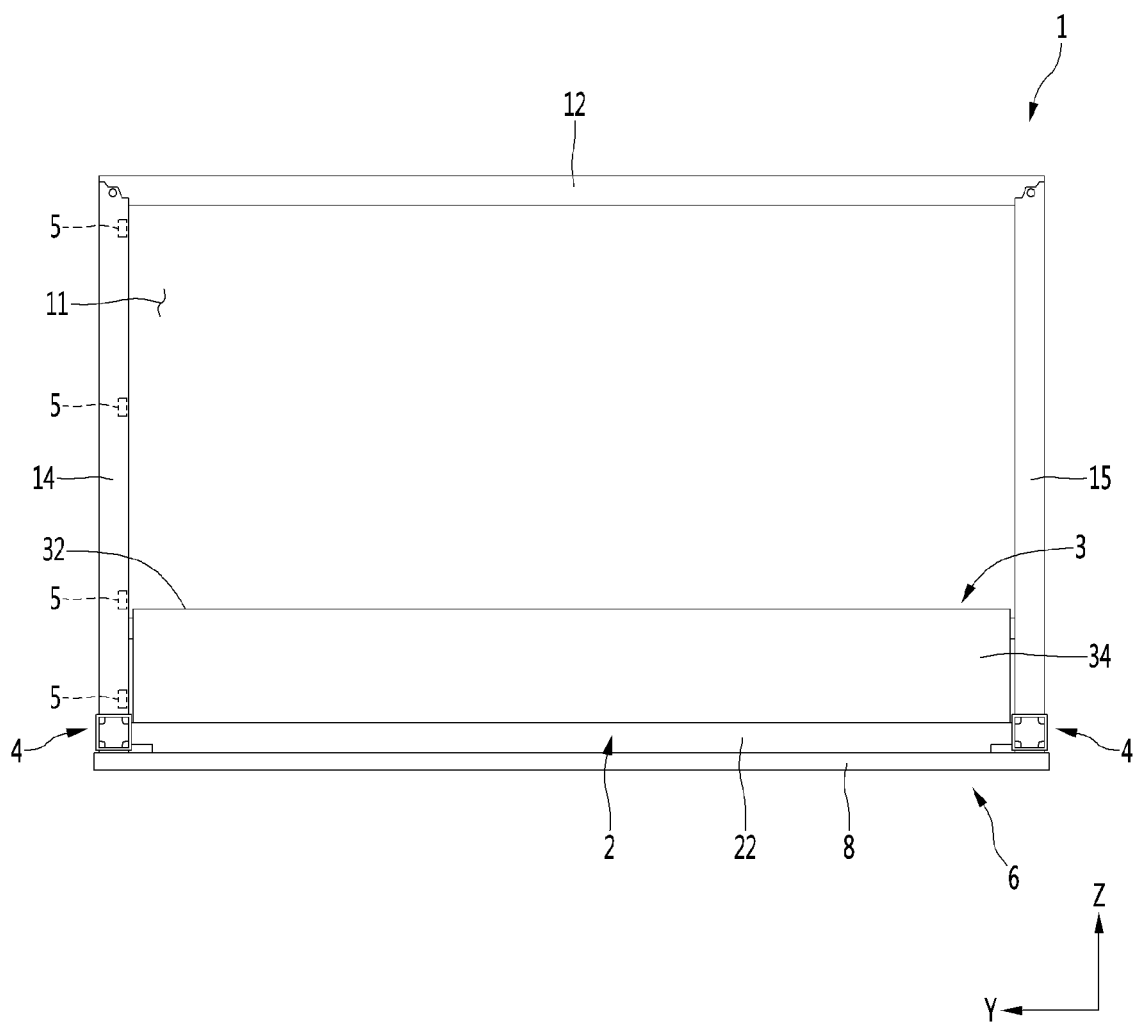

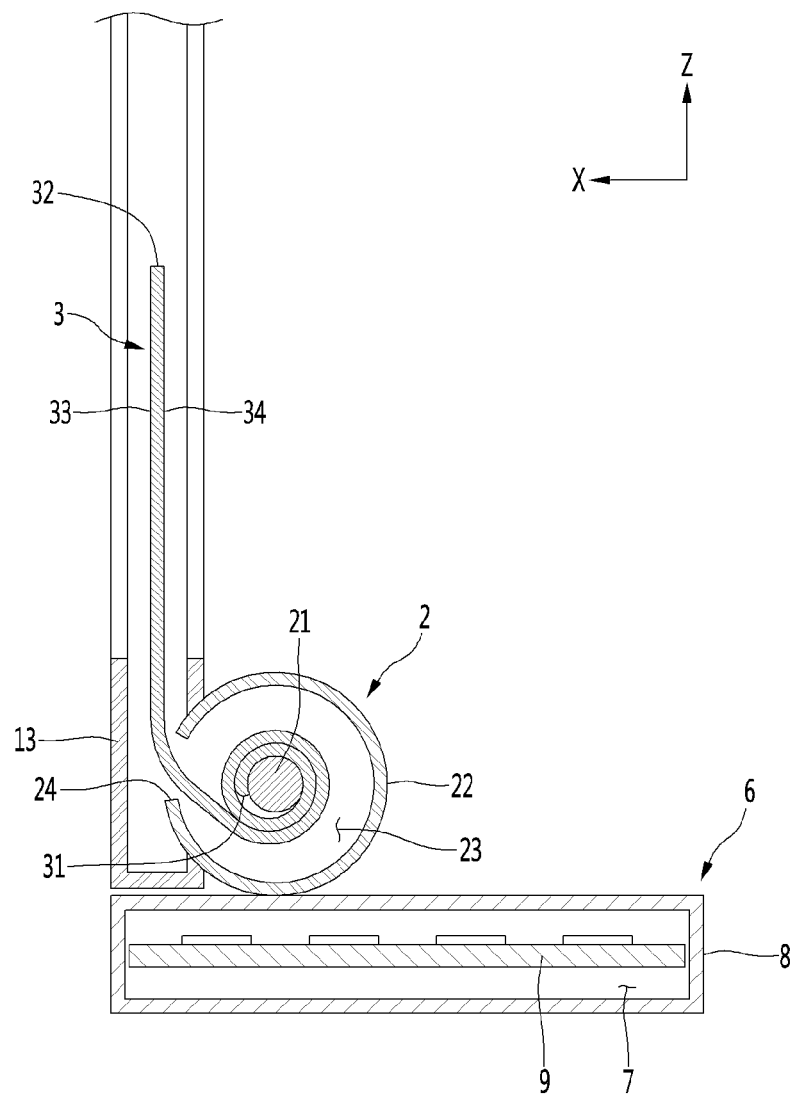
[Figure 4]

[Figure 5]
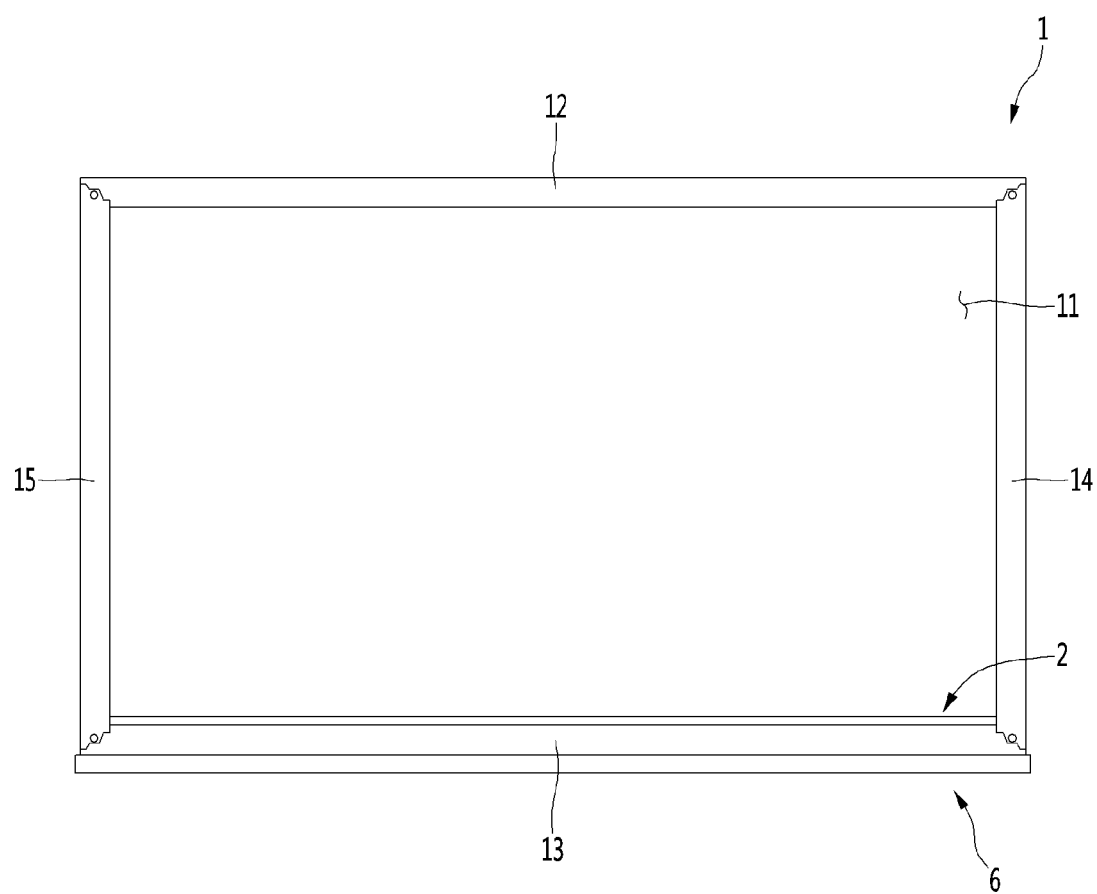

[Figure 6]
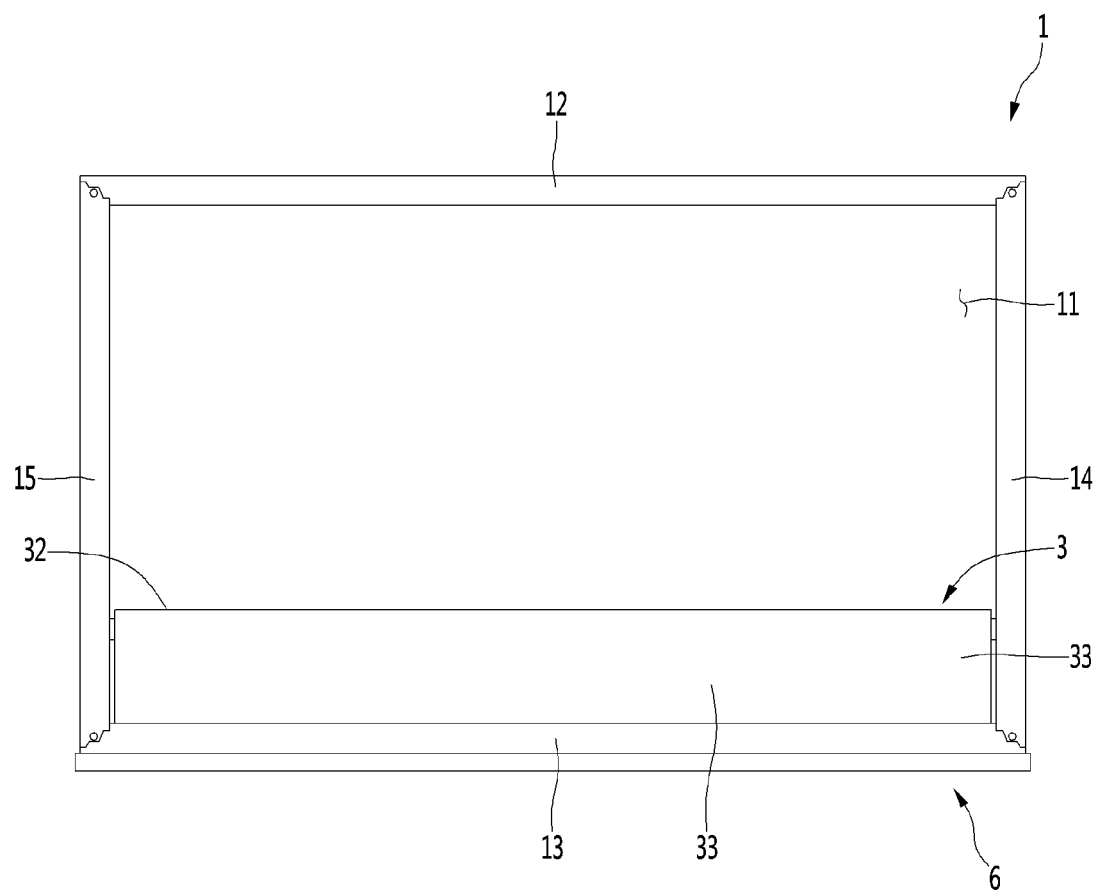

[Figure 7]
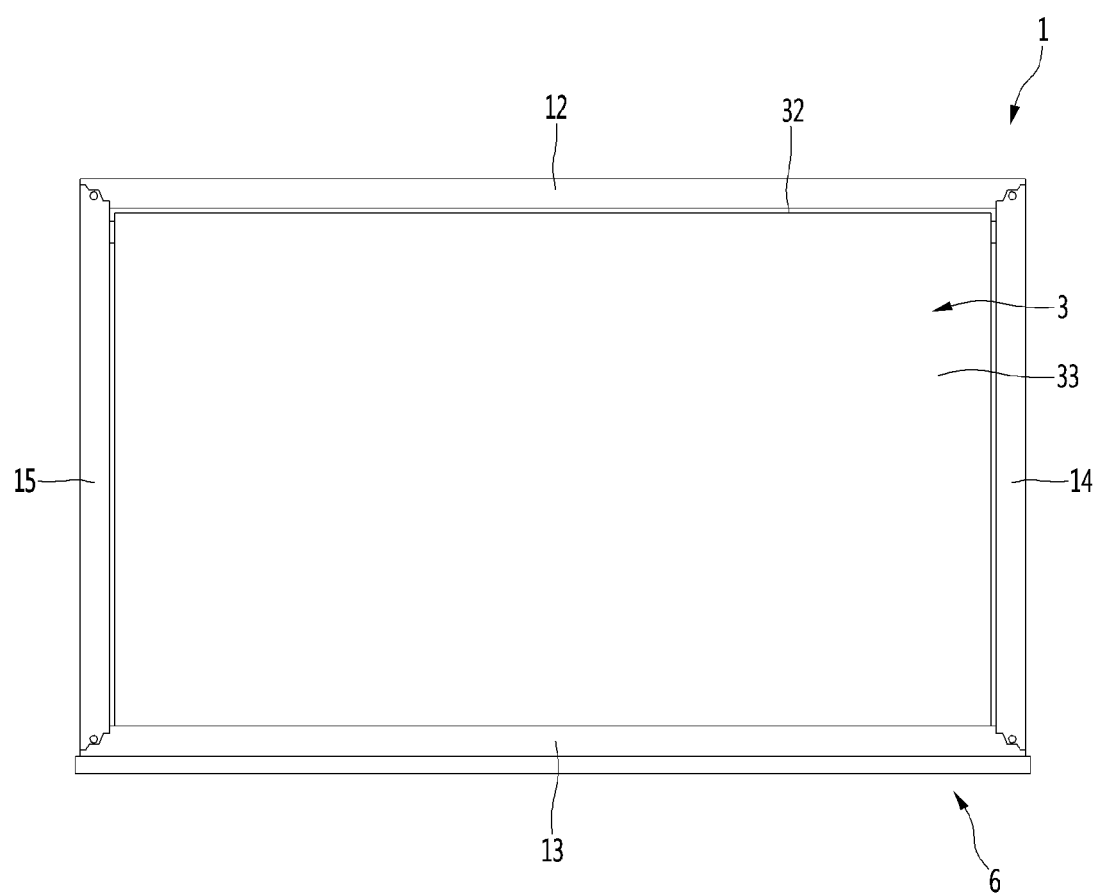

【Figure 8】
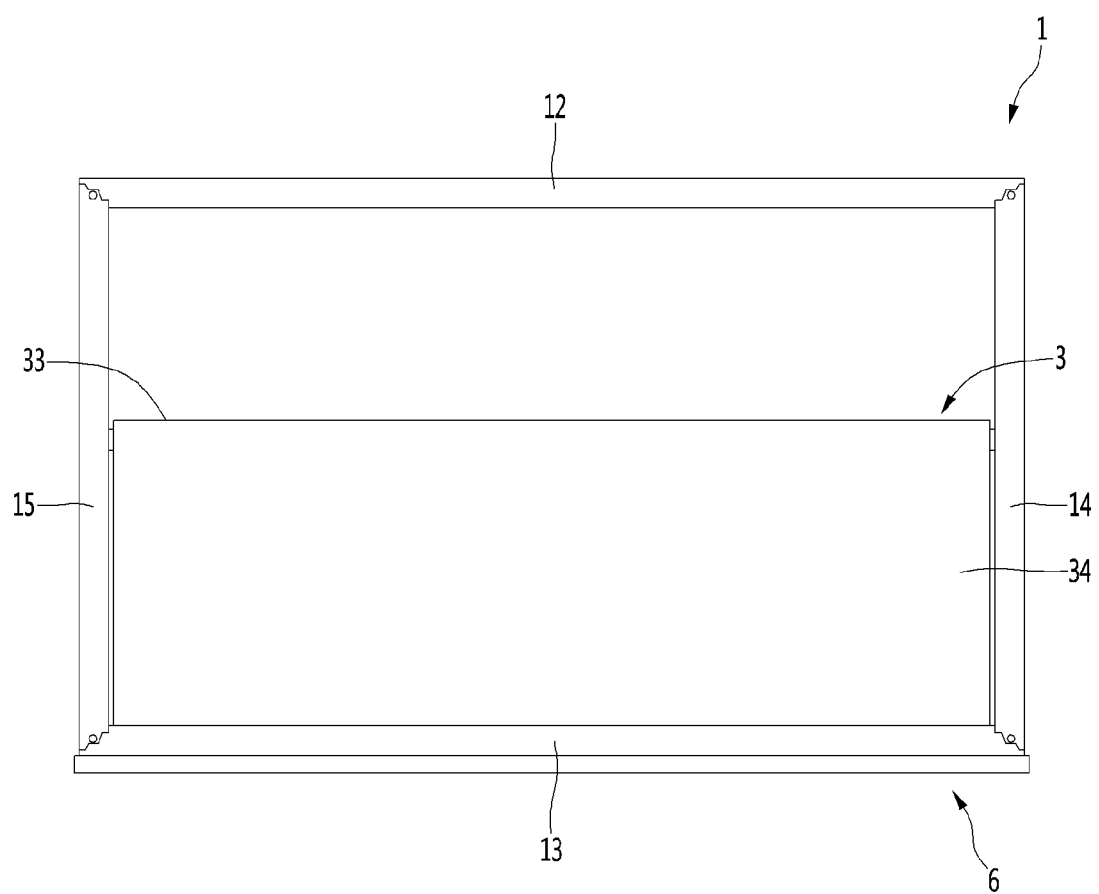

【Figure 9】
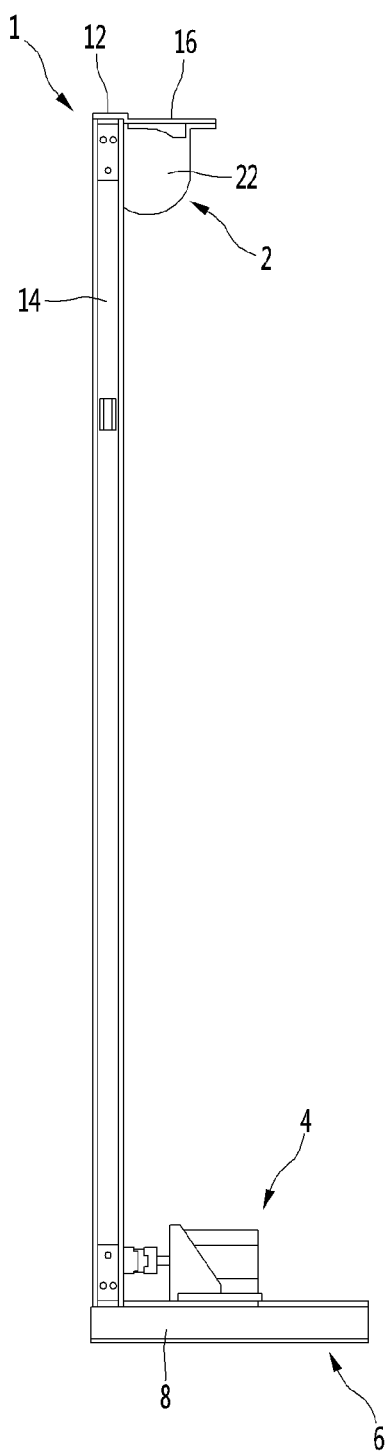

[Figure 10]
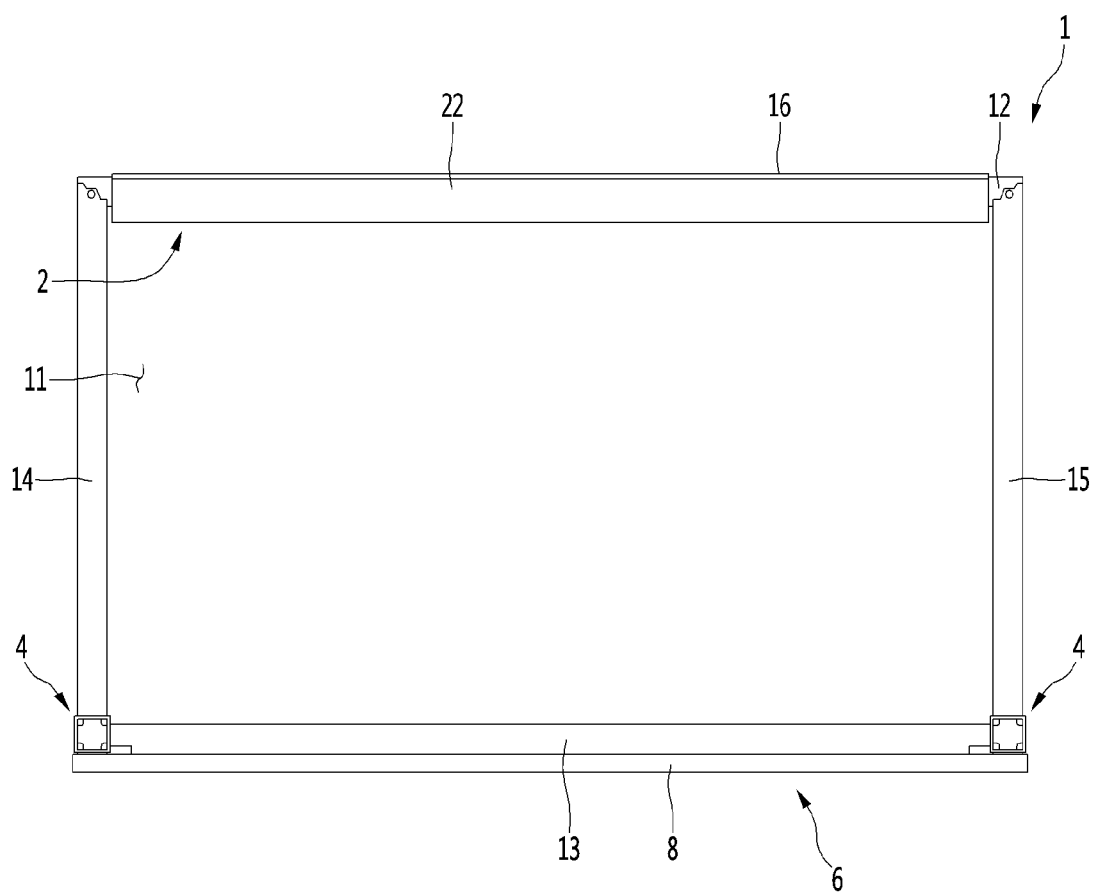

[Figure 11]
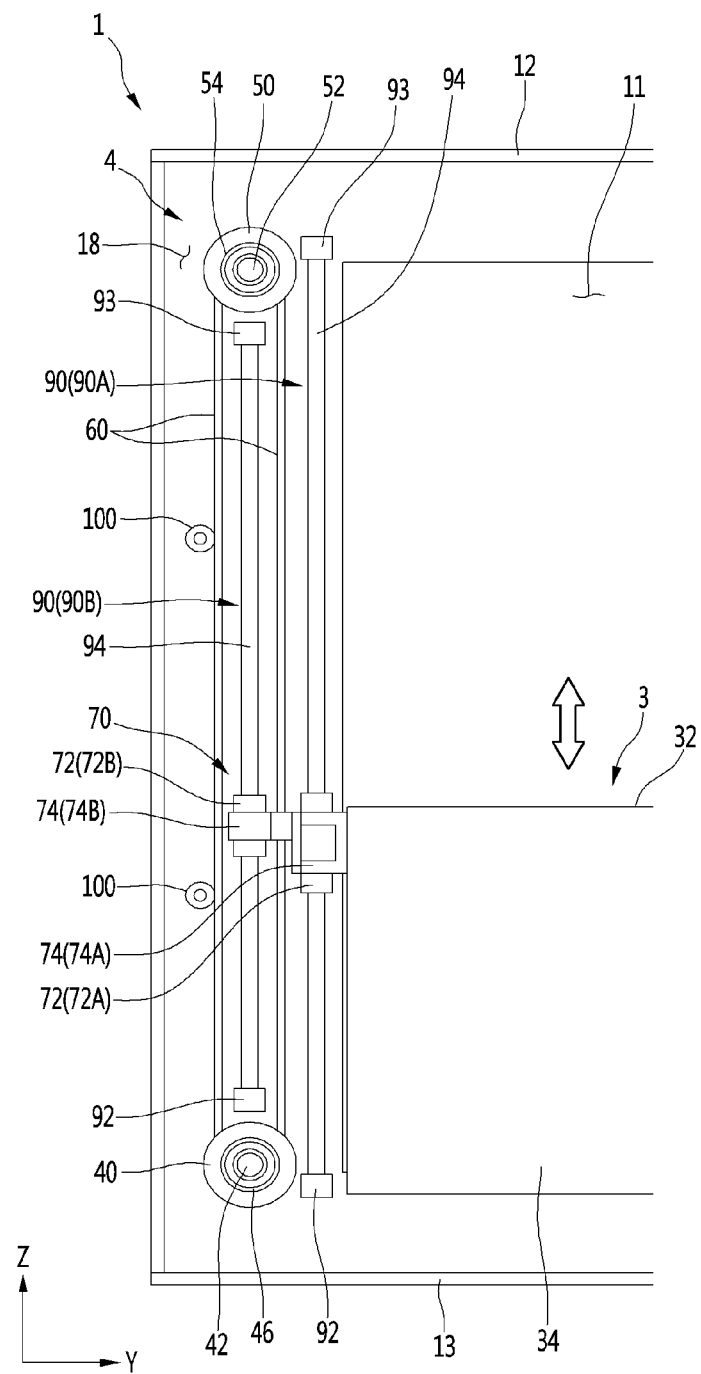

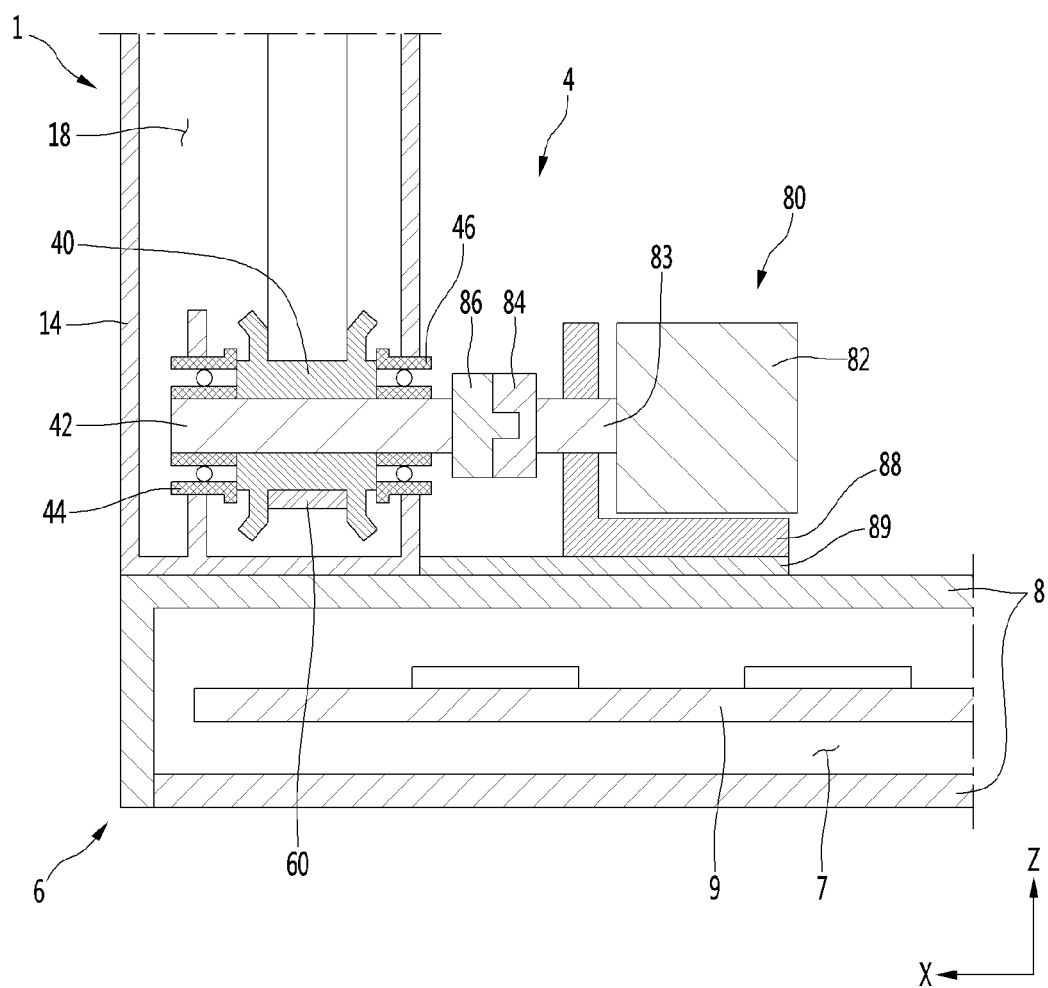
[Figure 12]

[Figure 13]
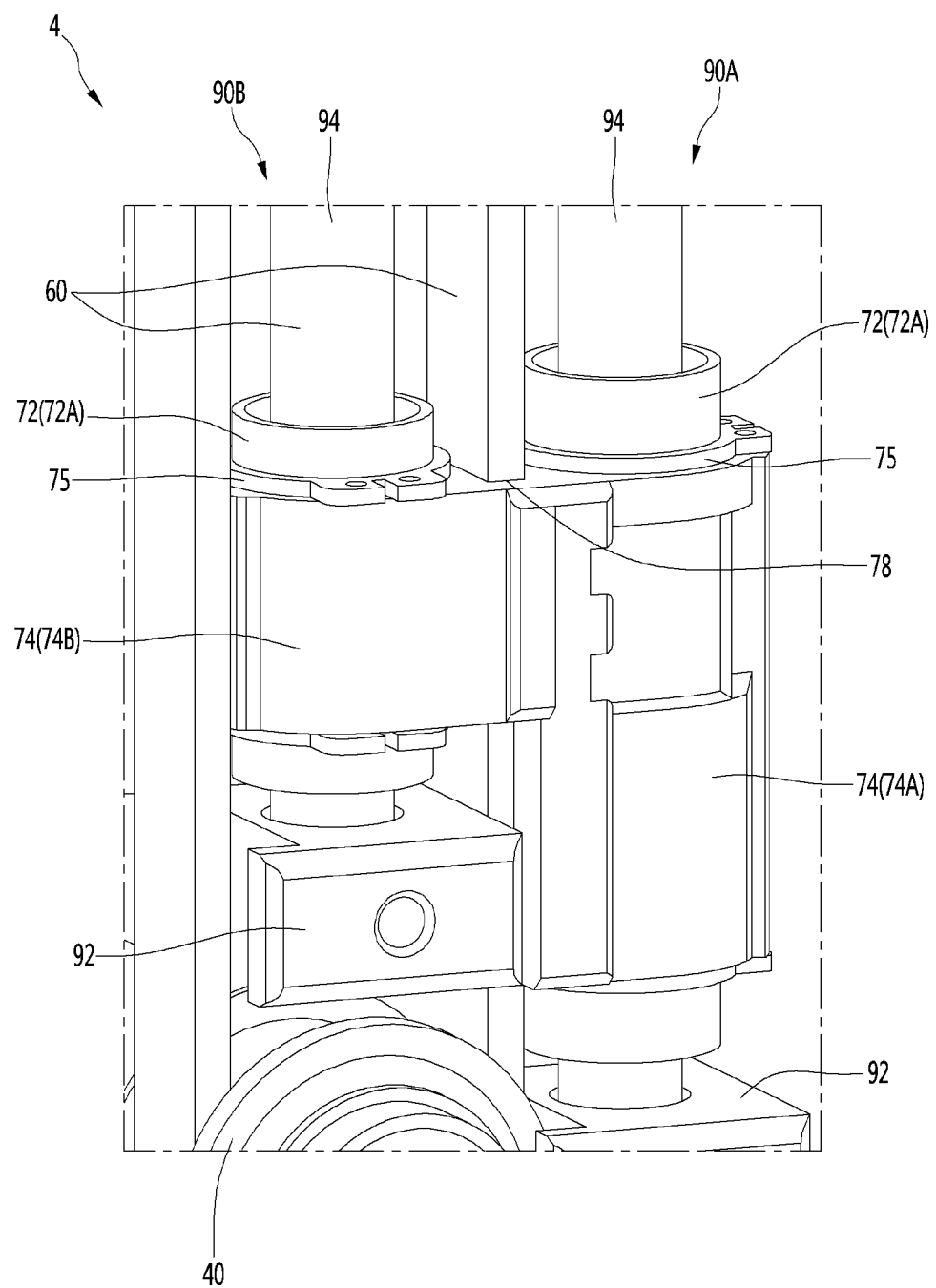

[Figure 14]
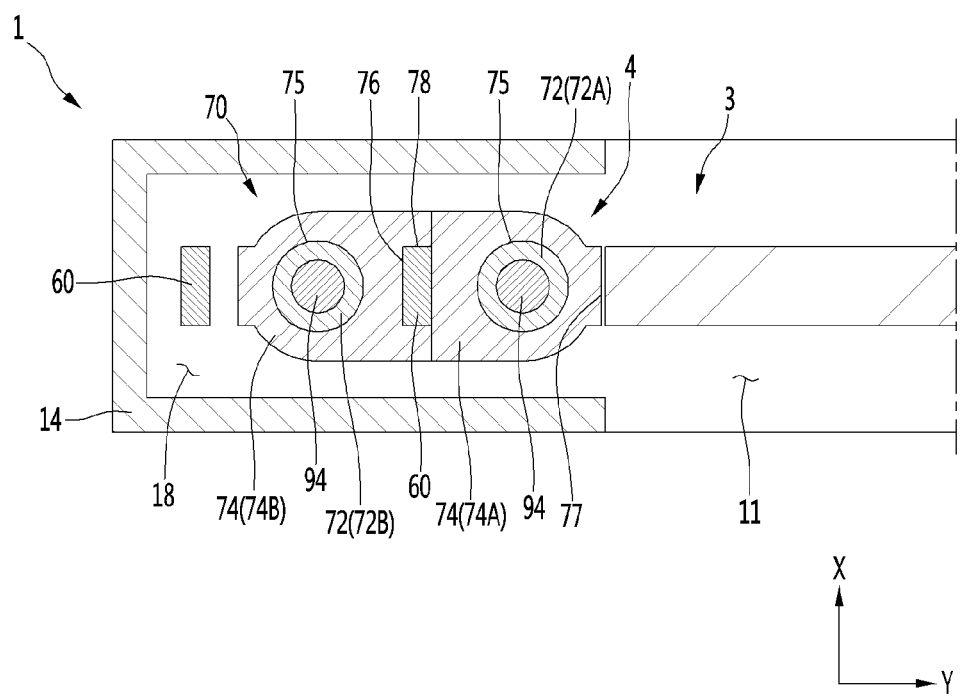

[Figure 15]
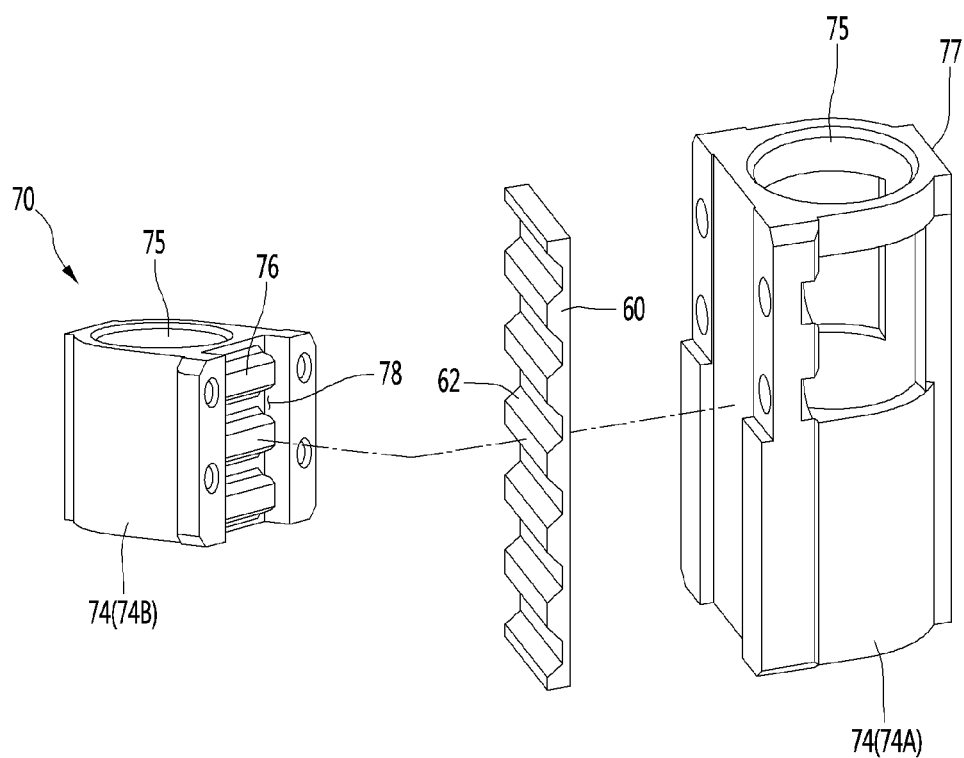

DISPLAY DEVICE

CROSS-REFERENCE TO RELATED APPLICATIONS

This application is the National Stage filing under 35 U.S.C. 371 of International Application No. PCT/KR2019/000993, filed on Jan. 24, 2019, which claims the benefit of U.S. Provisional Application No. 62/729,975, filed on Sep. 11, 2018, the contents of which are all hereby incorporated by reference herein in their entirety.

TECHNICAL FIELD

The present disclosure relates to a display device.

BACKGROUND ART

As the information society develops, the demand for a display device has been increased in various forms. Recently, various display devices, such as a liquid crystal display device (LCD), a plasma display panel (PDP), an electro-luminescent display (ELD), or a vacuum fluorescent display (VFD) have studied and used.

When compared to a liquid crystal display device, a display device using an OLED LCD may represent more excellent characteristics in brightness and viewing angle and may be implemented in an ultra-thin form as the liquid crystal display device does not require the backlight unit.

The display device may include a flexible display panel wound on or released from the roller. Korean Unexamined Patent Publication 10-2017-0062342 A (Jun. 7, 2017) discloses a display device having a link to operate such a display panel.

Such a display device may include gears engaged with each other as an upper link and a lower link positioned at the rear portion of the display panel correspond to each other. As the distance between the upper link and the lower link is varied, the display panel is wound on or released from the roller.

DISCLOSURE

Technical Problem

However, according to the related art, the display device may not protect a display module from an object approaching the display module, when the display module is exposed to the outside.

In addition, according to the display device of the related art, as the distance between the upper link and the lower link is varied, the display panel is operated. Accordingly, the upper link and the lower link may be exposed to the outside on the rear portion of the display module, the probability of the damage to the upper link and the lower link may be high, and the malfunction probability of the display module may be high. The present disclosure is to provide a display device capable of protecting a display module.

The present disclosure is to provide a display device capable of providing a display device capable of reducing the manufacturing cost by maximizing parts commonly used.

The present disclosure is to provide a display device capable of minimizing the shaking or the sagging of a display module.

Technical Solution

According to an embodiment of the present disclosure, a display device includes a frame having an opening, a roller assembly having a roller and mounted on the frame, a display module wound around the roller or unrolled from the roller, and a display operating mechanism mounted on the frame and connected with the display module to be unrolled in a direction crossing a direction of opening the opening or to be wound around the roller.

The display device may further include a controller to control the display operating mechanism.

The display device may include a sensor to sense the display module. The controller may control an area of an activation region, which is viewed through the opening, of the display module in multiple stages based on a sensing value of the sensor.

The controller may control the display operating mechanism in a plurality of modes.

An activation region, which is viewed through the opening, of the display module is varied in the plurality of modes.

The plurality of modes may include a first mode in which an area of the activation region is less than ½ of an area of the opening, and a second mode in which an area of the activation region exceeds ½ of the area of the opening.

The plurality of modes may further include a third mode larger than the first mode and smaller than the second mode in the area of the activation region.

The controller may control the display operating mechanism such that the activation region disappears or is minimized when the display device is powered off.

The frame may include a pair of first frame bodies spaced apart from each other, and a pair of second frame bodies coupled to the pair of first frame bodies. The opening may be formed by the pair of first frame bodies and the pair of second frame bodies.

The pair of first frame bodies are spaced apart from each other in a direction in which the display module is unrolled. The pair of second frame bodies are spaced apart from each other in a direction perpendicular to the direction in which the opening is open and to a direction in which the display module is unrolled.

A length of the first frame body may be longer than a length of the second frame body.

At least one of the pair of first frame bodies may cover the roller assembly.

The display moving mechanism may include a driving pulley, a driven pulley spaced apart from the driving pulley, a belt wound around the drive pulley and the driven pulley, a carrier linked to the display module and the belt, and a driving pulley rotating mechanism coupled to the driving pulley to rotate the driving pulley.

A frame space may be formed in the frame to receive the driving pulley, the driven pulley, and the belt.

The driving pulley rotating mechanism may be disposed outside the frame.

The display moving mechanism may further include at least one bearing provided on the frame to support a shaft of the driving pulley.

The display moving mechanism may include at least one guide body mounted on the frame to guide linear movement of the carrier.

The guide body further may include a guide block fixed to the frame, and a guide shaft coupled to the guide block and longitudinally extending in a direction in which the display module is unrolled.

The carrier may include a bush surrounding the guide body and disposed movably along the guide body, and a bush block including a bush coupling part coupled to the bush, a belt coupling part coupled to the belt, and a panel coupling part coupled to the display module.

The display moving mechanism may include a pair of guide bodies longitudinally extending in a direction in which the display module is unrolled, and spaced apart from each other.

The carrier may include a first bush movably disposed along one of the pair of guide bodies, a second bush movably disposed along a remaining one of the pair of guide bodies, and a bush block coupled to the first bush and the second bush and engaged with the display module.

The bush block may include a first bush block coupled to the first bush and having a panel coupling part formed at one side of the first block, and a second bush block coupled to the second bush and coupled to the first bush block.

A belt receiving space to receive a portion of the belt may be formed between the first bush block and the second bush block. A belt coupling part coupled to the belt may be formed in the second bush block.

One of the pair of guide bodies is positioned outside the belt. A remaining one of the pair of guide bodies has a length shorter than a length of the belt, and is positioned inside the belt.

The display device may further include at least one roller rotatably mounted in the frame, and making contact with the belt to guide the belt.

Advantageous Effects

According to an embodiment of the present disclosure, when the display module is moved to the viewable position, the frame may protect the display module around the display module, and the probability that the display module is damaged may be minimized.

In addition, the area of the activation region, which is viewed through the opening, of the display module may be adjusted in multiple steps, and the power consumption of the display module is minimized, which meet the various demands of customers.

In addition, when the display device is powered off, the opening is viewed as much as possible, and the activation region is minimized, so the power off of the display device may be easily recognized even at a remote distance.

In addition, at least one of the frame bodies constituting the frame covers the roller assembly. Accordingly, when the display device is powered off, the outer appearance of the display device may be simplified and provided with higher quality, and the frame body may protect the roller assembly, thereby minimizing the damage or the contamination of the roller assembly.

In addition, since the display moving mechanism including the driving pulley, the driven pulley, and the belt operates the display module, the space is more excellently utilized as compared to the display moving mechanism including the upper link and the lower link, and the entire portion or a portion of the display moving mechanism are received and hidden inside the frame.

In addition, since the display moving mechanism further includes the display module and the carrier linked to the belt, the damage to the display module may be minimized and the defect in the image of the display module may be minimized, as compared to the case that the belt is directly linked to the display module.

In addition, since the driving pulley, the driven pulley, and the belt may be received in the frame space formed in the frame, the damage to the driving pulley, the driven pulley, and the belt, or the contamination of the driving pulley, the driven pulley, and the belt may be minimized. In addition, the driving pulley, the driven pulley, and the belt viewed from the outside may be minimized. Accordingly, the outer appearance of the display device may be provided with higher quality. In addition, an accident caused when kids touch the driving pulley, the driven pulley, and the belt may be minimized.

In addition, the shaft of the driving pulley may be supported to the bearing provided on the frame, and the shaking of the shaft may be minimized, so the carrier and the display panel may be operated with higher precision.

In addition, as the guide body to guide the linear movement of the carrier is provided on the frame, the carrier may be linearly moved with higher reliability, and the sagging or the deformation of the display module may be minimized while the display module is operated.

In addition, since the carrier is linearly moved by a pair of guide bodies spaced apart from each other, the shaking of the carrier may be minimized when the carrier is moved, and the display module may be linearly moved with higher stability.

In addition, the bush block may be provided in the combination form of the first bush block and the second bush bock, the bush block may be linked to the belt in the state that the bush block surrounds a part of the belt, the coupling state between the bush block and the belt may be maintained with higher reliability, and the sliding of the bush block on the belt may be minimized.

In addition, since the pair of guide bodies guide the linear movement of the carrier on the outside and inside of the belt, the sagging or the shaking of the belt, which is caused by the weight of the carrier, may be minimized.

In addition, since the roller makes direct contact with the belt to guide the belt, the sagging or the shaking of the part, which is not wound on the driving pulley or the driven pulley, of the belt may be minimized, and the display module may be precisely operated.

DESCRIPTION OF DRAWINGS

FIG. 1 is a perspective view illustrating a display device, according to an embodiment of the present disclosure.

FIG. 2 is a side view illustrating the display device, according to an embodiment of the present disclosure.

FIG. 3 is a rear view illustrating the display device, according to an embodiment of the present disclosure.

FIG. 4 is a sectional view illustrating a roller assembly and a display module, according to an embodiment of the present disclosure.

FIG. 5 is a front view illustrating the display device in an off mode, according to an embodiment of the present disclosure.

FIG. 6 is a front view illustrating the display device in a first mode, according to an embodiment of the present disclosure.

FIG. 7 is a front view illustrating the display device in a second mode, according to an embodiment of the present disclosure.

FIG. 8 is a front view illustrating the display device in a third mode, according to an embodiment of the present disclosure.

FIG. 9 is a front view illustrating a display device having a display panel operating in a roll-top down manner by way of another example, according to an embodiment of the present disclosure.

FIG. 10 is a side view illustrating a display device by way of another example, according to an embodiment of the present disclosure.

FIG. 11 is a rear view illustrating the inner part of the frame, according to an embodiment of the present disclosure.

FIG. 12 is a sectional view taken along line A-A' of FIG. 2.

FIG. 13 is an enlarged perspective view illustrating a carrier, according to an embodiment of the present disclosure.

FIG. 14 is a sectional view taken along line B-B' of FIG. 1.

FIG. 15 is an exploded perspective view of a carrier illustrated in FIG. 13.

BEST MODE

Mode for Invention

Hereinafter, the embodiment of the present disclosure will be described in detail with reference to accompanying drawings.

FIG. 1 is a perspective view illustrating a display device, according to an embodiment of the present disclosure, FIG. 2 is a side view illustrating the display device, according to an embodiment of the present disclosure, FIG. 3 is a rear view illustrating the display device, according to an embodiment of the present disclosure, and FIG. 4 is a sectional view illustrating a roller assembly and a display module, according to an embodiment of the present disclosure.

According to the present disclosure, the display device may include a frame 1, a roller assembly 2, a display panel 3 and a display operating mechanism 4.

The display device may be a stand type display device to be upright on the floor, or to be mounted on a separate stand, a wall mount type display device mounted on a wall, or a ceiling type display device mounted on the ceiling.

An opening 11 may be formed in the frame 1. The opening 11 may be a space in which a portion of the display module 3 may be positioned.

The frame 1 may include a pair of first frame bodies 12 and 13 and a pair of second frame bodies 14 and 15.

The opening 11 may be a space surrounded by the frame 1. The opening 11 may be formed by the pair of first frame bodies 12 and 13 and the pair of second frame bodies 14 and 15.

The pair of first frame bodies 12 and 13 may be spaced apart to each other. The pair of first frame bodies 12 and 13 may be spaced apart from each other in the direction Z in which the display module 3 is unrolled.

The pair of first frame bodies 12 and 13 may longitudinally extend in a direction Y perpendicular a direction X in which the opening 11 is open and a direction Z in which the display module 3 is unrolled.

The pair of second frame bodies 14 and 15 may link the pair of first frame bodies 12 and 13 to each other. The pair of second frame bodies 14 and 15 may be spaced apart from each other. The pair of second frame bodies 14 and 15 are spaced apart from each other in the direction Y perpendicular the direction X in which the opening 11 is open and the direction Z in which the display module 3 is unrolled. The pair of second frame bodies 14 and 15 may longitudinally extend in the direction Z in which the display module 3 is unrolled.

The pair of first frame bodies 12 and 13 may extend longer than the pair of second frame bodies 14 and 15, and the outer circumference and the inner circumference of the frame 1 may be formed in a rectangular shape.

When the display device is a stand type or wall mount type, any one of the pair of first frame bodies 12 and 13 may be an upper frame body 12, and a remaining one of the pair of first frame bodies 12 and 13 may be a lower frame body 13. One of the pair of second frame bodies 14 and 15 may be a left frame body 14, and a remaining one of the pair of second frame bodies 14 and 15 may be a right frame body 15. The opening 11 may be formed by the upper frame body 12, the lower frame body 13, the left frame body 14, and the right frame body 15, and may be opened in the front-rear direction X. The opening 11 may be defined as an open space surrounded by the upper frame body 12, the lower frame body 13, the left frame body 14, and the right frame body 15. In this case, in the frame 1, the width of the widthwise direction Y may be longer than the width of the lengthwise direction Z, and lengths of the upper frame body 12 and the lower frame body 13 may be longer than the lengths of the left frame body 14 and the right frame body 15.

When the display device is a stand type or a wall mount type, the roller assembly 2 and the display operating mechanism 4 may be arranged such that parts of the roller assembly 2 and the display operation mechanism 4 viewed from the front are minimized. The roller assembly 2 and the display operating mechanism 4 may be mounted on the frame 1 in such a manner that the roller assembly 2 and the display operating mechanism 4 are positioned at the rear portion of the frame 1.

When the display device is a ceiling type, one of the pair of first frame bodies 12 and 13 may be a front frame body, and the remaining of the pair of first frame bodies 12 and 13 may be a rear frame. In addition, one of the pair of second frame bodies 14 and 15 may be a left frame body, and a remaining one of the pair of second frame bodies 14 and 15 may be a right frame body. In this case, the lower frame body is the same feature as that of the front frame body 12 and the lower frame body is the same feature as that of the lower frame body 13. In this case, the opening 11 may be formed by the front frame body, the rear frame body, and the left frame body and the right frame body, and may be opened in the vertical direction Z.

When the display device is a ceiling type, the roller assembly 2 and the display operating mechanism 4 may be arranged such that parts the roller assembly 2 and the display operating mechanism 4 viewed from the bottom are minimized. The roller assembly 2 and the display operating mechanism 4 may be mounted on the frame 1 in such a manner that the roller assembly 2 and the display operating mechanism 4 are positioned at the top of the frame 1.

The frame 1 may cover the roller assembly 2.

When the display device is a stand type or a wall mount type, at least one of the pair of first frame bodies 12 and 13 may cover the roller assembly 2 in front of the roller assembly 2

When the display device is a ceiling type, at least one of the pair of first frame bodies 12 and 13 may cover the roller assembly 2 under the roller assembly 2

The roller assembly 2 may constitute a rollable display module together with the display module 3.

The roller assembly 2 may be mounted on the frame 1. The roller assembly 2 may include the roller 21. The roller assembly 2 may further include a housing 22 in which the roller 21 is received. The roller 21 may be rotatably disposed in the housing 22. A space 23 may be formed in the housing 22 in which the roller 21 may be rotatably received.

The housing 22 may have a through hole 24 through which the display module 3 passes.

When the display device is the stand type or the wall type, the through hole 24 may face the opening 11 or face the rear portion of the opening 11. The portion of the display module 3, which passes through the through hole 24 and is positioned in the opening 11 or in back of the opening 11 may be a first area that the user may view from the outside of the frame 1. The portion of the display module 3, which is received in the space 23 of the housing 22, may be a second area that the user may not see from the outside.

When the display device is a ceiling type, the through hole 24 may face the opening 11 or above the opening 11. The portion of the display module 3, which passes through the through hole 24 and is positioned in the opening 11 or above the opening 11 may be a first area that the user may view from the outside of the frame 1. The portion, which is received in the space 23 of the housing 22, of the display module 3, may be a second area that the user may not view from the outside.

The display module 3 may be wound on the roller 21 or may be released from the roller 5. The display module 3 may have one end 3 (hereinafter, referred to as a link end) linked to the roller 21 and an opposite end 32 (hereinafter, referred to as a free end) which is positioned in opposition to the link end 32 without being linked to the roller 21 as illustrated in FIG. 4.

The free end 32 of the display module 3 may move the direction Z perpendicular to the direction X in which the opening 11 is open and the lengthwise direction Y of the pair of first and second frame bodies 12 and 13.

The display module 3 may be a flexible display module. The display module 3 may include a display panel 33. The display panel 33 may preferably include a stretchable panel, such as an OLED, that may be bent or rolled. In this case, the display panel 33 may be a flexible display panel such as the OLED panel.

The display panel 33 may display a video through one surface thereof. A portion, which is exposed to the outside, of the display panel 33 may be an activation region, the video of which is viewed from the outside. A portion, which is received in the space 23 of the housing 22, of the display panel 33 may be a deactivation region, the video of which is not viewed from the outside.

The display module 3 may further include a display cover 34 supporting the display panel 33.

The display cover 34 may be disposed on the display panel 33 and may cover an opposite surface to one surface of the display panel 33 which displays an image.

The display cover 34 may be wound on the roller 21 together with the display panel 33. The display cover 34 may be configured to support the display panel 33. The display cover 34 may have the stiffness higher than that of the display panel 33.

The display cover 34 may be attached to the display panel 33. The display cover 34 may be attached to the display panel 33 by an adhesive unit such as a double-sided tape, and may be integrated with the display panel 33.

The display cover 34 may include a plurality of segments. The segment may be referred to as an apron. Each of the plurality of segments may be attached to the display panel 33.

The display operating mechanism 4 may be mounted on the frame 1. The display operating mechanism 4 may operate the display module 3. Herein, the operation of the display module 3 may be defined as being changing the position of the free end 32 by the display operating mechanism 4.

The display operating mechanism 4 may operate the display module 3 such that the display module 3 is wound on the roller 21. The display operating mechanism 4 may operate the display module 3 such that the display module 3 is released from the roller 21 while being unrolled.

The display operating mechanism 4 may be connected with the display module 3. The display operating mechanism 4 may operate the display module 3 such that the display module 3 is unrolled in the direction Z crossing the direction X of opening the opening 11.

The display device may include a pair of display moving mechanisms 4. The pair of display moving mechanisms 4 may be spaced apart from in a direction perpendicular to the direction X of opening the opening 11 and the direction Z of operating the display module 3.

The pair of display moving mechanisms 4 may be configured identically to each other and may be arranged symmetrically to each other on the frame 1.

One of the pair of display moving mechanisms 4 may be a left display moving mechanism connected with the left side of the display module 1, and a remaining one of the pair of display moving mechanisms 4 may be a right display moving mechanism connected with the right side of the display module 1.

The pair of display moving mechanisms 4 may operate the display module 3 together, and the display module 3 may be operated with higher stability by the pair of display moving mechanisms 4.

The display device may include a sensor 5 to sense the display module 3. The display device may further include a controller 6 to control the operation of the display device.

Various sensors, such as a switch, a magnetic sensor, or an optical sensor, may be applied to the sensor 5 without the limitation in the type of the sensor 5 as long as the various sensors sense the present state (for example, the height or the position of the display module) of the display module 3. The sensor 5 may be a height sensor (or position sensor) to sense the height (or position) of the display module 2. The sensor 5 may be provided for each of the off mode, the first mode, the second mode, and the third mode.

The controller 6 may be connected with the display module 3 to control the display module 3. The controller 6 may be connected with the display operating mechanism 4 to control the display operating mechanism 4.

The controller 6 may control the display operating mechanism 4 depending on the sensing value of the sensor 5.

The controller 6 may control the position (or height) of the free end 32 by controlling the position of the sensor 5 or the motor 82 described later.

The controller 6 may be connected with the frame 1.

Referring to FIG. 4, the controller 6 may include a control box 8 having a space 7 formed therein and a control board 9, such as a control printed circuit board, received in the space 7 of the control box 8 and having a power module mounted t hereon.

When the display device is a stand type or a wall mount type, the controller 6 may be disposed under the frame 1 and the frame 1 may be supported to the controller 6. The controller 6 may be arranged at the rear portion the frame 1, and the frame 1 may cover the controller 6 in front of the controller 6.

When the display device is a ceiling type, the controller 6 may be arranged around an outer circumference of the frame 1 or above the frame 1. The frame 1 may cover the controller 6 under the controller 6.

Each of the roller assembly 2 and the controller 6 may be disposed closer to any one of the pair of first frame bodies 12 and 13. For example, each of the roller assembly 2 and the controller 6 may be disposed closer to the lower frame body 13 than to the upper frame body 12.

Meanwhile, when the display device includes the frame 1 described above, various models of display devices may be manufactured and sold according to the sizes of the outer portion of the frame 1. Such various models of display devices may employ parts other than the frame 1 in common, so the manufacturing cost of the manufacturer may be minimized.

FIG. 5 is a front view illustrating the display device in an off mode, according to an embodiment of the present disclosure. FIG. 6 is a front view illustrating the display device in a first mode, according to an embodiment of the present disclosure. FIG. 7 is a front view illustrating the display device in a second mode, according to an embodiment of the present disclosure. FIG. 8 is a front view illustrating the display device in a third mode, according to an embodiment of the present disclosure.

The controller 6 (see FIGS. 1 to 4), a portion, which is viewed through the opening 1, of the display module 3 may be controlled in multiple stages as illustrated in FIGS. 5 to 8.

The controller 6 may control the display operating mechanism 4 in multiple modes. The multiple modes may be modes in which the position (or height) of the free end 32 of the display module 3 is different. The portion (hereinafter, referred to as an "activation region"), which is viewed through the opening 11, of the display module 3 may be different depending on the position (or the height) of the free end 32

The area of the activation region may be determined depending on modes of the display operating mechanism 4.

The controller 6 may control the display operating mechanism 4 such that the activation region disappears or is minimized as illustrated in FIG. 5, when the display device is powered off.

The multiple modes may be two or three or more.

When the multiple modes are two, the multiple modes may include an off mode and an on mode.

In the off mode and the on mode, a portion (hereinafter, referred to as a "deactivation region"), which is not viewed through the opening 11, of the display module may be different.

The off mode may be a mode in which the activation region is minimized and the deactivation region is maximized. The off mode may be a mode in which the controller 6 controls the display operating mechanism 4 such that the entire portion of the display module 3 is not visible through the opening 11. The controller 6 may control the display operating mechanism 4 in the off mode when the display device is powered off.

When compared to the activation region and the deactivation region in the off mode, the area of the activation region is more expanded and the area of the deactivation region is more reduced in the on mode.

When the multiple modes are three modes or more, the multiple modes may include the off mode, the first mode, and the third mode, or may include the off mode, the first mode, the second mode, and the third mode.

The first mode may be a mode in which the area of the activation region is less than ½ of the area of the opening 11. The first mode may be a mode in which the activation region is larger than an activation region in the off mode. By example of the first mode, the area of the activation region may be in the range of 5% to 30% of the area of the opening 11. For example, the display device may be in an information mode in which information such as weather or time is displayed. In this case, the display device may be in the first mode. The first mode may be a mode in which the ratio of the width to the length of the activation region is 48:9.

The second mode may be a mode in which the area of the activation region exceeds ½ of the area of the opening 11. The second mode may be a mode in which the area of the activation region is the largest, among the multiple modes. In this case, the second mode may be a mode in which the area of the activation region may be smaller than the area of the opening 11, but greater than ½ of the area of the opening 11. The second mode may be a broadcast video mode in which a user watches a broadcast. The second mode may be a mode in which the ratio of the width to the height of the activation region is 16:9.

The third mode may be a mode in which the area of the activation region is larger than that in the first mode and smaller than that in the second mode. The third mode may be a movie watching mode in which a user may watch a movie. The second mode may be a mode in which the area of the activation region is smaller than the area of the opening 11, but approximately equal to the area of the opening 11, and the third mode may be a mode in which the area of the activation region is smaller than that in the second mode, but greater than ½ of the area of the opening 11. The third mode may be a mode in which the ratio of the width to the length of the activation region is 21:9.

When the multiple modes include the first mode, the second mode, and the third mode as described above, the display device may adjust the ratio of the activation region (for example, the screen) in three steps, and a consumer may recognize information, view a broadcast, and view a movie in a desired mode.

FIG. 9 is a side view illustrating a display device by way of another example, according to an embodiment of the present disclosure, and FIG. 10 is a front view illustrating a display device having a display panel operating in a roll-top down manner by way of another example, according to an embodiment of the present disclosure.

In the display device illustrated in FIGS. 9 and 10, any one of the pair of first frame bodies 12 and 13 is closer to the roller assembly 2 of the roller assembly 2 and the controller 6, and a remaining one of the pair of first frame bodies 12 and 13 may be closer to the controller 6 of the roller assembly 2 and the controller 6.

The roller assembly 2 may be disposed closer to any one of the pair of first frame bodies 12 and 13, and the controller 6 may be disposed closer to a remaining one of the pair of first frame bodies 12 and 13.

For example, when the display device is a stand type or a wall mount type, the roller assembly 2 may be disposed closer to the upper frame body 12 positioned at an upper one of the pair of first frame bodies 12 and 13. The controller 6 may be disposed closer to the lower frame body 13 positioned of the pair of first frame bodies 12 and 13.

To the contrast, the roller assembly 2 may be disposed closer to the lower frame body 13 than the upper frame body 12, and the controller 6 may be disposed closer to the upper frame 12 than the lower frame body 13.

The frame 1 may further include a mounter 16 coupled to the roller assembly 2. The mounter 16 may be disposed on at least one of the pair of first frame bodies 12 and 13, and the roller assembly 2 may be mounted on the frame 1 by the mounter 16.

When the display device includes the frame 1 and the roller assembly 2 is disposed at the rear portion of the lower frame body 13 as illustrated in FIG. 2, the display device may operate the display module 3 in the roll-bottom up manner. When the display device includes the frame 1 and the roller assembly 2 is disposed at the rear portion of the upper frame body 12 as illustrated in FIG. 9, the display device may operate the display module 3 in the roll-top down manner.

In this case, the roll-bottom up manner may be defined as a manner in which the activation region is increased as the free end 32 of the display module 3 is moved up, and the roll-top down manner may be defined as a manner in which the activation region is increased, as the free end 32 of the display module 2 is moved down.

In the display device, the roll-bottom up manner and the roll-top down manner may be determined depending on the mounting position of the roller assembly 2.

A manufacturer may manufacture and sell a display device in one of the roll-bottom up manner and the roll-top down manner, or may manufacture and sell a display device in both the roll-bottom up manner and the roll-top down manner. In this case, most of parts are commonly used in the display device in the roll-bottom up manner and the display device in the roll-top down manner, so the manufacturing cost of the manufacture may be minimized.

FIG. 11 is a rear view illustrating the inner part of the frame, according to an embodiment of the present disclosure and FIG. 12 is a sectional view taken along line A-A' of FIG. 2. FIG. 13 is an enlarged perspective view illustrating a carrier, according to an embodiment of the present disclosure, FIG. 14 is a sectional view taken along line B-B' of FIG. 1, and FIG. 15 is an exploded perspective view of a carrier illustrated in FIG. 13.

The display moving mechanism 4 may include a driving pulley 40, a driven pulley 50, a belt 60, a carrier 70, and a driving pulley rotating mechanism 80. In addition, the display moving mechanism 4 may further include a guide body 90.

As illustrated in FIG. 12, the driving pulley 40 may be coupled to the driving pulley rotating mechanism 80 and may be rotated by the driving pulley rotating mechanism 80. The driving pulley 40 may include a shaft 42, and the shaft 42 may be coupled to the drive pulley rotating mechanism 80.

At least one bearing may be disposed around the driving pulley 40 to rotatably support the shaft 42. In the display moving mechanism 4, a pair of bearings 44 and 46 may support the shaft 42 as illustrated in FIG. 12. The pair of bearings 44 and 46 may be spaced apart from each other while interposing the driving pulley 40 therebetween, and may stably support the shaft 42.

The driven pulley 50 may be spaced apart from the driving pulley 50. The driven pulley 50 and the driving pulley 50 may be spaced apart from each other in the direction Z of operating the display module 3. A support shaft 52 may be coupled to the driven pulley 50, and at least one bearing 54 rotatably supporting the support shaft 52 may be disposed around the driven pulley 50. A pair of bearings 54 may be provided to support the support shaft 52, may be spaced apart from each other while interposing the driven pulley 50 therebetween, and may stably support the support shaft 52.

The belt 60 may be wound on the driving pulley 40 and the driven pulley 50. When the driving pulley 40 and the driven pulley 50 are spaced apart from each other in the vertical direction Z, the belt 60 may be longitudinally disposed in the vertical direction Z.

The belt 60 may be formed of a material that may be curved to rotate along the outer circumferential surface of each of the driving pulley 40 and the driven pulley 50.

A carrier coupling part 62 (see FIG. 15) coupled to the carrier 70 may be formed on the inner circumferential surface of the belt 60. The belt 60 may be linked to the display module 3 through the carrier 70.

Meanwhile, the outer circumferential surface of the belt 60 may be formed to be flat without a roughness. The outer circumferential surface of the belt 60 may be guided by the roller 100 while sliding along the outer circumferential surface of the roller 100 (see FIG. 11) to be described.

The frame 1 may be formed therein with a frame space 10 to receive the driving pulley 40, the driven pulley 50, and the belt 60.

The whole shape of the frame 1 may be a rectangular parallelepiped shape having the opening 11. The frame space 18 may be defined by the pair of first frame bodies 12 and 13 and the pair of second frame bodies 14 and 15 to receive an entire portion or a portion of the display moving mechanism 4. The driven pulley 40, the driving pulley 50, the belt 60, the guide body 90, and the roller 100 may be received and disposed in the frame space 18.

The frame space 18 may be formed in each pair of the pair of first frame bodies 12 and 13 and the pair of the second frame bodies 14 and 15 or may be formed only in the inside of the pair of the second frame bodies 14 and 15.

The sectional shape of each of the pair of first frame bodies 12 and 13 and the pair of second frame bodies 14 and 15 may be a substantially 'C' shape or an arc shape.

The frame space 18 may communicate with the opening 11 in a direction Y or Z perpendicular to the direction X in which the opening 11 is open.

The carrier 70 may be linked to the display module 3 and the belt 60. The carrier 70 may be guided on the guide body 90, and operate the display module 3 while sliding along the guide body 90.

The display moving mechanism 4 does not include the carrier 70, but the display module 3 may be directly coupled to the belt 60. However, the belt 60 may be formed of a material that may be cured. When the sagging degree or curving degree of the belt 60 is large, the belt 60 may pull or push the display module 3 in a direction perpendicular to the direction Z of operating the display module 3 or in a direction inclined with respect to the direction Z. In this case, the display module 3 may be damaged or the image of the display module 3 may be distorted.

When the belt 60 is linked to the display module 3 through the carrier 70, and when the carrier 70 is linearly moved along the guide body 90, even if a portion of the belt 60 is sagged or curved, the carrier 70 may linearly move along the guide body 90 while operate the display module 3 with a higher sense of stability.

The carrier 70 may be configured to be coupled with the display module 3 while sliding along the guide body 90. The carrier 70 may include a bush 72 and a bush block 74.

The bush 72 may be disposed to surround the guide body 90 while moving along the guide body 90. The bush 72 may be formed in a hollow cylindrical shape, the inner diameter of the bush 72 may be larger than that of the guide shaft 94, and the bush 72 may slide along the outer circumferential surface of the guide shaft 94.

The blush block 74 may include a bush coupling part 75 coupled to the bush 72. The bush coupling part 95 may be a bush through hole such that the bush 72 passes through the bush through hole. The bush block 74 may be disposed to surround the entire portion or a portion of an outer circumferential surface of the bush 72.

The bush block 74 may include a belt coupling part 76 (see FIG. 15) coupled to the belt 60. The belt coupling part 76 may be an uneven part in which protrusions and grooves are alternately formed, and may be shape-coupled to the carrier coupling part 62 (see FIG. 15) formed on the belt 80.

The bush block 74 may include a panel coupling part 77 coupled to the display module 3. The panel coupling part 77 may be formed on a surface, which faces the display module 3, of the bush block 74. The panel coupling part 77 may be coupled to the display module 3 by an adhesive unit such as an adhesive.

The bush block 74 may link the bush 72 to the display module 3, between the bush 72 and the display module 3, and the carrier 70 may help the display module 3 smoothly operate while sliding along the guide body 90 when the position of the free end 32 of the display module 3 is moved.

As illustrated in FIG. 12, the driving pulley rotating mechanism 80 may be linked to the driving pulley 40 to rotate the driving pulley 40. The driving pulley rotating mechanism 80 may include a motor 82 and at least one power transmission member 84 and 86 to transmit the driving force of the motor 82 to the driving pulley 40.

The driving pulley rotating mechanism 80 may be disposed outside the frame 1.

The driving pulley rotating mechanism 80 may include couplings 84 and 86 linked to the driving pulley 40.

In the driving pulley rotating mechanism 80, a rotation shaft 83 of the motor 82 may be linked to the couplings 84 and 86. The couplings 84 and 86 may be provided in pair, any one of the pair of couplings 84 and 86 may be coupled to the rotation shaft of the motor 82, and a remaining one of the pair of couplings 84 and 86 may be coupled to the shaft 42 of the driving pulley 40. The couplings 84 and 86 may be prevented from being sagged or twisted.

The driving pulley rotating mechanism 80 may include a motor bracket 88 to fix the motor 82. The motor bracket 88 may be coupled to a mounter 89 coupled to the frame 1.

The driving pulley rotating mechanism 80 may further include a gear box including a plurality of gears to transmit the power of the motor 82 to the shaft 42. The gear box may include at least two gears for speed control. In this case, the rotation shaft 83 or the shaft 42 may be coupled to one of gear boxes.

At least one guide body 90 may be installed in the frame 1, and may guide linear movement of the carrier 70.

The guide body 90 may include at least one guide block fixed to the frame 1, and a guide shaft 94 coupled to the guide block and formed to extend in the direction Z in which the display module 3 is unrolled.

The guide body 90 may include a pair of guide blocks 92 and 93. The pair of guide blocks 92 and 93 may be spaced apart in the operation direction Z of the display module 3. The guide shaft 94 may extend longitudinally in the direction Z of operating the display module 3, between a pair of guide blocks 92 and 93.

The guide body 90, the bearings 44 and 46 supporting the shaft 42, and the bearing 54 supporting the support shaft 52 may be provided to prevent the carrier 70 and the display module 3 from being shaken back, forth, left, and right.

The sectional area of each of the pair of guide blocks 92 and 93 may be larger than the sectional area of the guide shaft 94. The pair of guide blocks 92 and 93 may function as a stopper to restrict the excessive movement of the carrier 70.

The carrier 70 may be locked to any one 92 of the pair of guide blocks 92 and 93 when the display device is in the off mode. In this case, the carrier 70 may position the display module 3 to an off position (for example, a reference position) with a higher position.

The carrier 70 may be locked to a remaining one 93 of the pair of guide blocks 92 and 93 when the display device is in the second mode. In this case, the carrier 70 may minimize the deviation in the activation region of the display module 3.

Meanwhile, the display device may have a two-row support structure to minimize the shaking of the display module 3. A pair of guide bodies 90 may be provided in the display device. The display moving mechanism 4 may include a pair of guide bodies 90A and 90B spaced apart from each other.

Each of the pair of guide bodies 90A and 90B may longitudinally extend in the direction Z in which the display module 3 is unrolled. The pair of guide bodies 90A and 90B may be received side by side in the frame space 18.

The pair of guide bodies 90A and 90B may be spaced apart from each other by a distance greater than the thickness of the belt 60.

Any one 90A of the pair of guide bodies 90A and 90B may be positioned outside the belt 60, and the remaining one 90B of the pair of guide bodies 90A and 90B may be positioned inside a belt.

The guide body 90A (hereinafter, referred to as an outer guide body) positioned outside the belt 60 may be disposed to be spaced apart from the belt 60. The guide body 90B (hereinafter, referred to as an inner guide body) positioned inside the belt 60 may be disposed to be spaced apart from the belt 60, and may be shorter than the length of the belt 60. The inner guide body 90B may be disposed longitudinally between the driving pulley 40 and the driven pulley 50.

When the display moving mechanism 4 includes a pair of guide bodies 90A and 90B, the carrier 70 may be disposed while sliding along the pair of guide bodies 90A and 90B as illustrated in FIGS. 13 to 15.

The bush 72 may be provided for each of the pair of guide bodies 90A and 90B. The carrier 70 may include a first bush 72A and a second bush 72A.

The first bush 72A may be movably disposed along any one 90A of the pair of guide bodies 90A and 90B.

The second bush 72B may be disposed movably along a remaining one 90B of the pair of guide bodies 90A and 90B.

The first bush 72A and the second bush 72A may be linked to each other by a link member. In this case, the first bush 72A and the second bush 72A may slid along a pair of guide bodies 90A and 90B.

The bush block 74 may be liked to each of the first bush 72A and the second bush 72B and may be linked to the display module 3. When the belt 60 is moved, the carrier 70 may be moved up or down while being guided by each of the pair of guide bodies 90A and 90B. The carrier 70 may control the display module 3 while minimizing the shaking of the carrier 70.

The bush block 74 may be the link member for allowing the first bushing 72A and the second bushing 72A to simultaneously move.

The belt 60 may be coupled to the bush block 74 in such a manner that the belt 60 passes through the bush block 74, and a belt receiving space 78 may be formed in the bush block 74 such that a portion of the belt 60 is received in the belt receiving space 78. The bush block 74 may be coupled to the belt 60 while surrounding a portion of the belt 60.

The bush block 74 may be provided in the form of one member or may be provided in the combination form of a plurality of members.

When the bush block 74 is provided in the combination form of the plurality of members, the bush block 74 may be disposed to surround a portion of the belt 60 and may be coupled to the belt 60 with higher reliability.

When the bush block 74 is provided in the combination form of a plurality of members, the bush block 74 may include a first guide block 74A and a second bush block 74B.

The first guide block 74A may be coupled to the first bush 72A, and a bush coupling part 75 coupled to the first bush 72A may be formed in the first bush block 74A. The first bush block 74A may be formed at one side thereof with a panel coupling part 77 coupled to the display module 3.

The second bush block 74B may be coupled to the first bush block 74A. The second bush block 74B may be coupled to the first bush block 74A by a fastening member such as a screw or a fastening part such as a hook. The second bush block 74B may be coupled to the second bush 72B. The second bush block 74B may include a bush coupling part 75 coupled to the second bush 72B. The belt coupling part 76 coupled to the belt 60 may be formed in the second bush block 74B.

A belt receiving space 78 may be formed between the first bush block 74A and the second bush block 74B. The belt receiving space 78 may be formed in a shape recessed in at least one of the first bush block 74A and the second bush block 74B.

Meanwhile, the display device may further include at least one roller 100 rotatably mounted on the frame 1 and making contact with the belt 60 to guide the belt 60. The roller 100 may be rotatably received in the space 18 of the frame 1 and may minimize the sagging of the belt 60.

When the display moving mechanism 4 includes a pair of guide bodies 90A and 90B spaced apart from each other, a pair of bushes 72A and 72B spaced apart from each other, and a bush block 74 to link the pair of bushes 72A and 72B to each other, the display moving mechanism 4 may operate the display module 3 while minimizing the shaking of the display module 3 back, forth, left or right and the sagging of the display module 3.

Hereinabove, although the present disclosure has been described with reference to exemplary embodiments and the accompanying drawings, the present disclosure is not limited thereto, but may be variously modified and altered by those skilled in the art to which the present disclosure pertains without departing from the spirit and scope of the present disclosure claimed in the following claims.

Therefore, the embodiments of the present disclosure are provided to explain the spirit and scope of the present disclosure, but not to limit them, so that the spirit and scope of the present disclosure is not limited by the embodiments.

The scope of the present disclosure should be construed on the basis of the accompanying claims, and all the technical ideas within the scope equivalent to the claims should be included in the scope of the present disclosure.

The invention claimed is:

1. A display device comprising:
a frame having an opening;
a roller assembly coupled to the frame, wherein the roller assembly includes a roller;
a display module structured to be rolled around the roller and unrolled from the roller; and
a display operating mechanism coupled to the frame and the display module, wherein the display operating mechanism functions to:
cause the display module to extend in a first direction and be unrolled from the roller; and
cause the display module to retract in a second direction and be rolled around the roller,
wherein the display operating mechanism includes:
a driving pulley;
a driven pulley spaced apart from the driving pulley;
a belt wound around the driving pulley and the driven pulley;
a carrier linked to the display module and the belt; and
a driving pulley rotating mechanism coupled to the driving pulley to rotate the driving pulley.

2. The display device of claim 1, further comprising:
a controller configured to control the display operating mechanism to cause the display module to extend in the first direction and retract in the second direction.

3. The display device of claim 2, further comprising:
a sensor configured to sense a present state of the display module,
wherein the controller is further configured to control an area of an activation region of the display module in multiple steps based on an input provided by the sensor, wherein the activation region corresponds to a portion of the display module that is viewable through the opening.

4. The display device of claim 2, wherein an area of an activation region of the display module corresponds to a portion of the display module that is viewable through the opening,
wherein the controller is further configured to control the display operating mechanism to function in a plurality of modes,
wherein the plurality of modes include:
a first mode in which an area of the activation region is less than ½ of an area of the opening; and
a second mode in which an area of the activation region exceeds ½ of the area of the opening.

5. The display device of claim 4, wherein the plurality of modes further include a third mode in which an area of the activation region is larger than the area of the activation region of the first mode and smaller than the area of the activation region of the second mode.

6. The display device of claim 2, wherein the controller is further configured to:
control the display operating mechanism to cause an activation region of the display module to be minimized or no longer viewable via the opening when the display device is powered off.

7. The display body of claim 1, wherein the frame includes:
a pair of first frame bodies spaced apart from each other; and
a pair of second frame bodies coupled to the pair of first frame bodies, and
wherein the opening is formed by the pair of first frame bodies and the pair of second frame bodies.

8. The display device of claim 7, wherein the pair of first frame bodies are spaced apart from each other in the first direction in which the display module is unrolled from the roller, and
wherein the pair of second frame bodies are spaced apart from each other in a direction perpendicular to a direction in which the opening is open and to the first direction in which the display module is unrolled.

9. The display device of claim 7, wherein a length of the first frame body is longer than a length of the second frame body, and wherein at least one body of the pair of first frame bodies covers the roller assembly.

10. The display device of claim 1, wherein a frame space is formed in the frame to receive the driving pulley, the driven pulley, and the belt.

11. The display device of claim 1, wherein the driving pulley rotating mechanism is disposed outside the frame, and
wherein the display operating mechanism further includes at least one bearing disposed on the frame to support a shaft of the driving pulley disposed.

12. The display device of claim 1, wherein the display operating mechanism includes at least one guide body mounted on the frame to guide linear movement of the carrier.

13. The display device of claim 12, wherein the at least one guide body further includes:
a guide block fixed to the frame; and
a guide shaft coupled to the guide block and longitudinally extending in the first direction in which the display module is unrolled.

14. The display device of claim 12, wherein the carrier includes:
a bushing surrounding the at least one guide body and shaped to be movable along the at least one guide body; and
a bushing block including a bushing coupling part coupled to the bushing, a belt coupling part coupled to the belt, and a panel coupling part coupled to the display module.

15. The display device of claim 1, wherein the display operating mechanism includes a pair of guide bodies longitudinally extending in the first direction in which the display module is unrolled, and spaced apart from each other, and
wherein the carrier includes:
a first bushing shaped to be movable along one body of the pair of guide bodies;
a second bushing shaped to be movable along a remaining body of the pair of guide bodies; and
a bushing block coupled to the first bushing and the second bushing and engaged with the display module.

16. The display device of claim 15, wherein the bushing block includes:
a first bushing block coupled to the first bushing and having a panel coupling part formed at one side of the first bushing block; and
a second bushing block coupled to the second bushing and coupled to the first bushing block.

17. The display device of claim 16, wherein a belt receiving space to receive a portion of the belt is formed between the first bushing block and the second bushing block, and
wherein a belt coupling part coupled to the belt is formed in the second bushing block.

18. The display device of claim 15, wherein one body of the pair of guide bodies is positioned outside the belt, and
wherein a remaining body of the pair of guide bodies has a length shorter than a length of the belt, and is positioned inside the belt.

19. The display device of claim 1, further comprising:
at least one roller rotatably mounted in the frame, and making contact with the belt to guide the belt.

* * * * *